United States Patent
Wu (10) Patent No.: US 10,594,311 B2
(45) Date of Patent: Mar. 17, 2020

(54) DRIVER CIRCUIT

(71) Applicant: MEDIATEK Inc., Hsin-Chu (TW)

(72) Inventor: Chien-Hua Wu, Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/464,375

(22) Filed: Mar. 21, 2017

(65) Prior Publication Data

US 2018/0131360 A1    May 10, 2018

Related U.S. Application Data

(60) Provisional application No. 62/418,302, filed on Nov. 7, 2016.

(51) Int. Cl.
| | | |
|---|---|---|
| H03B 1/00 | (2006.01) | |
| H03K 3/00 | (2006.01) | |
| H03K 17/04 | (2006.01) | |
| H03K 19/0185 | (2006.01) | |

(52) U.S. Cl.
CPC ......... H03K 17/04 (2013.01); H03K 19/0185 (2013.01)

(58) Field of Classification Search
CPC ...................................................... H03K 17/04
USPC .................................................. 327/108–111
See application file for complete search history.

(56) References Cited

U.S. PATENT DOCUMENTS

| | | | | |
|---|---|---|---|---|
| 5,689,201 A | * | 11/1997 | Temes ............... | G11C 27/026 327/95 |
| 6,617,838 B1 | * | 9/2003 | Miranda ............ | G01R 19/0092 324/117 R |
| 8,026,760 B1 | * | 9/2011 | Prasad .................. | H03F 3/005 330/311 |
| 9,024,659 B2 | | 5/2015 | Ali et al. | |
| 2007/0229046 A1 | * | 10/2007 | Johnson ............. | H03H 19/004 323/282 |
| 2017/0026004 A1 | * | 1/2017 | Stuenkel ............ | H03F 3/45475 |
| 2017/0187335 A1 | * | 6/2017 | Nicollini ............ | H03F 3/45475 |

OTHER PUBLICATIONS

TIPO Office Action dated Jun. 11, 2018 in Taiwan application (No. 106116856).
Sin-Luen Cheung: "1-V Switched-Capacitor Pseudo-2-Path Filter"; Department of Electrical and Electronic Engineering, Bachelor of Engineering in Electronic Engineering (1997), The Hong Kong University of Science and Technology; Aug. 1999; pp. 1-2.

* cited by examiner

*Primary Examiner* — Metasebia T Retebo
(74) *Attorney, Agent, or Firm* — McClure, Qualey & Rodack, LLP (57) ABSTRACT

A driver circuit is provided. The driver circuit includes a differential driver, a first feedback passive circuit and a second feedback passive circuit. The differential driver includes a first half circuit and a second half circuit. The first half circuit has a first input point and a first output point. The second half circuit has a second input point and a second output point. The first feedback passive circuit is coupled to the second input point and the first output point. The second feedback passive circuit is coupled to the first input point and the second output point.

6 Claims, 8 Drawing Sheets

DRIVER CIRCUIT

This application claims the benefit of U.S. provisional application Ser. No. 62/418,302, filed Nov. 7, 2016, the disclosure of which is incorporated by reference herein in its entirety.

TECHNICAL FIELD

The disclosure relates in general to an electronic circuit, and more particularly to a driver circuit.

BACKGROUND

In traditional SERDES designs, switching partial driver one by one with a delay line, and adding capacitor at output points are the two traditional designs to slow down the slew rate of the transmitter driver. However, both of these two traditional designs only slow down the slew rate of the transmitter driver, and the those two traditional designs cannot speed up the slew rate of the transmitter driver.

In some case, it is needed to speed up the slew rate of the transmitter diver. Therefore, researchers are trying to improve those designs to selectively slow down and speed up the slew rate of the transmitter driver.

SUMMARY

The disclosure is directed to a driver circuit. A first feedback passive circuit and a second feedback passive circuit are used, such that the slew rate of the driver circuit can be controlled to be speeded up or be slowed down to meet the design need.

According to one embodiment, a driver circuit is provided. The driver circuit includes a differential driver, a first feedback passive circuit and a second feedback passive circuit. The differential driver includes a first half circuit and a second half circuit. The first half circuit has a first input point and a first output point. The second half circuit has a second input point and a second output point. The first feedback passive circuit is coupled to the second input point and the first output point. The second feedback passive circuit is coupled to the first input point and the second output point.

According to another embodiment, a driver circuit is provided. The driver circuit includes a differential driver, a first feedback passive circuit and a second feedback passive circuit. The differential driver includes a first half circuit and a second half circuit. The first half circuit has a first input point and a first output point. The second half circuit has a second input point and a second output point. The first feedback passive circuit is coupled to the first input point and the first output point. The second feedback passive circuit is coupled to the second input point and the second output point.

According to an alternative embodiment, a driver circuit is provided. The driver circuit includes a differential driver, a first feedback passive circuit, a second feedback passive circuit and a switch circuit. The differential driver includes a first half circuit and a second half circuit. The first half circuit has a first input point and a first output point. The second half circuit has a second input point and a second output point. The switch circuit is for switching the driver circuit between a first mode and a second mode. In the first mode, the first feedback passive circuit is coupled to the second input point and the first output point, and the second feedback passive circuit is coupled to the first input point and the second output point. In the second mode, the first feedback passive circuit is coupled to the first input point and the first output point, and the second feedback passive circuit is coupled to the second input point and the second output point.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1A:
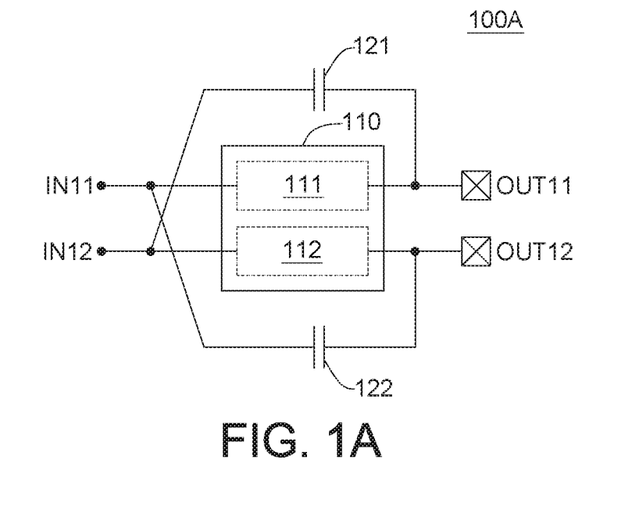
FIG. 1A shows a driver circuit according to one embodiment.

Please refer to FIG. 1A, which shows a driver circuit 100A according to one embodiment. The driver circuit 100A includes a differential driver 110, a first feedback passive circuit 121 and a second feedback passive circuit 122. The differential driver 110 includes a first half circuit 111 and a second half circuit 112. The first half circuit 111 has a first input point IN11 and a first output point OUT11. The second half circuit 112 has a second input point IN12 and a second output point OUT12.

The differential driver 110 may be a voltage mode driver or a current mode driver. Each of the first feedback passive circuit 121 and the second feedback passive circuit 122 may be a capacitor, a resistor, an inductor or a combination thereof. In this embodiment, each of the first feedback passive circuit 121 and the second feedback passive circuit 122 is a capacitor.

The first feedback passive circuit 121 is coupled to the second input point IN12 and the first output point OUT11; and the second feedback passive circuit 122 is coupled to the first input point IN11 and the second output point OUT12. That is to say, the first feedback passive circuit 121 and the second feedback passive circuit 122 are cross coupled between the first input point IN11, the second input point IN12, the first output point OUT11 and the second output point OUT12. In this embodiment, the slew rate of the driver circuit 100A can be speeded up due to the cross coupled feedback circuitry arrangement.

The first feedback passive circuit 121 and the second feedback passive circuit 122 in the cross coupled feedback circuitry arrangement are substantially equivalent. For example, the capacitance value of the first feedback passive circuit 121, which is a capacitor, is substantially equivalent to the capacitance value of the second feedback passive circuit 122, which is a capacitor, such that the feedback through the first feedback passive circuit 121 and the second feedback passive circuit 122 can be balanced.

Figure 1B:
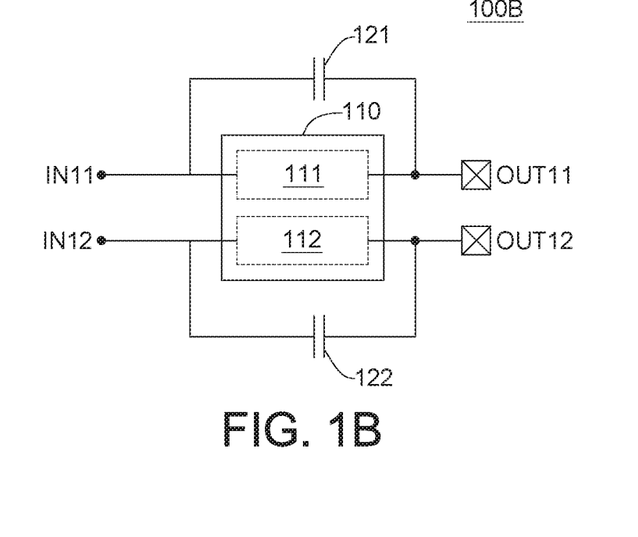
FIG. 1B shows a driver circuit according to one embodiment.

Please refer to FIG. 1B, which shows a driver circuit 100B according to one embodiment. In the driver circuit 100B, the first feedback passive circuit 121 is coupled to the first input point IN11 and the first output point OUT11; and the second feedback passive circuit 122 is coupled to the second input point IN12 and the second output point OUT12. That is to say, the first feedback passive circuit 121 and the second feedback passive circuit 122 are parallel coupled between the first input point IN11, the second input point IN12, the first output point OUT11 and the second output point OUT12. In this embodiment, the slew rate of the driver circuit 100B can be slowed down due to the parallel coupled circuity arrangement.

The first feedback passive circuit 121 and the second feedback passive circuit 122 in the parallel coupled feedback circuitry arrangement are substantially equivalent. For example, the capacitance value of the first feedback passive circuit 121, which is a capacitor, is substantially equivalent to the capacitance value of the second feedback passive circuit 122, which is a capacitor, such that the feedback through the first feedback passive circuit 121 and the second feedback passive circuit 122 can be balanced.

Figure 1C:
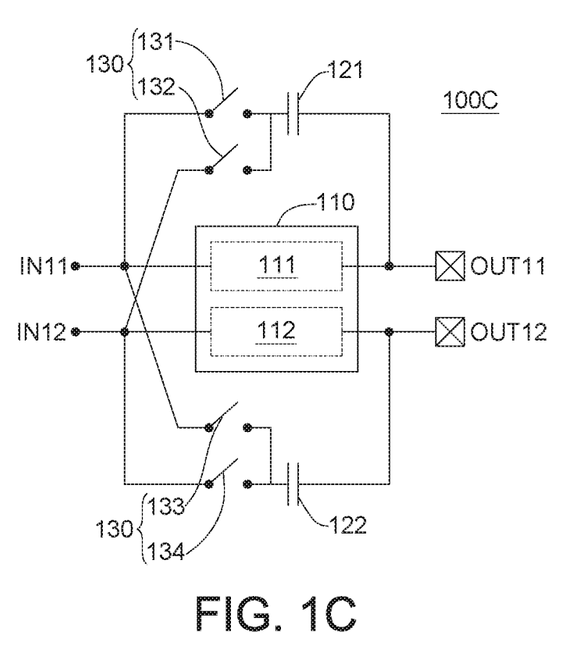
FIG. 1C shows a driver circuit according to one embodiment.

Please refer to FIG. 1C, which shows a driver circuit 100C according to one embodiment. In the driver circuit 100C, the driver circuit 100C further includes a switch circuit 130. The switch circuit 130 is for switching the driver circuit 100C between a first mode and a second mode.

In the first mode, the first feedback passive circuit 121 is coupled to the second input point IN12 and the first output point OUT11; and the second feedback passive circuit 122 is coupled to the first input point IN11 and the second output point OUT12.

In the second mode, the first feedback passive circuit 121 is coupled to the first input point IN11 and the first output point OUT11; and the second feedback passive circuit 122 is coupled to the second input point IN11 and the second output point IN12.

For example, the switch circuit 130 includes a first switch device 131, a second switch device 132, a third switch device 133 and a fourth switch device 134. The first switch device 131 is disposed between the first feedback passive circuit 121 and the first input point IN11. The second switch device 132 is disposed between the first feedback passive circuit 121 and the second input point IN12. The third switch device 133 is disposed between the second feedback passive circuit 122 and the first input point IN11. The fourth switch device 134 is disposed between the second feedback passive circuit 122 and the second input point IN12.

In the first mode, the second switch device 132 and the third switch device 133 are turned on and the first switch device 131 and the fourth switch device 134 are turned off. As such, a cross coupled feedback circuitry arrangement is formed, and the slew rate of the driver circuit 100C can be speeded up.

In the second mode, the first switch device 131 and the fourth switch device 134 are turned on and the second switch device 132 and the third switch device 133 are turned off. As such, a parallel coupled feedback circuitry arrangement is formed and the slew rate of the driver circuit 100C can be slowed down.

That is to say, the driver circuit 100C can be switched between the first mode and the second mode for selectively slowing down or speeding up the slew rate.

Figure 2A:
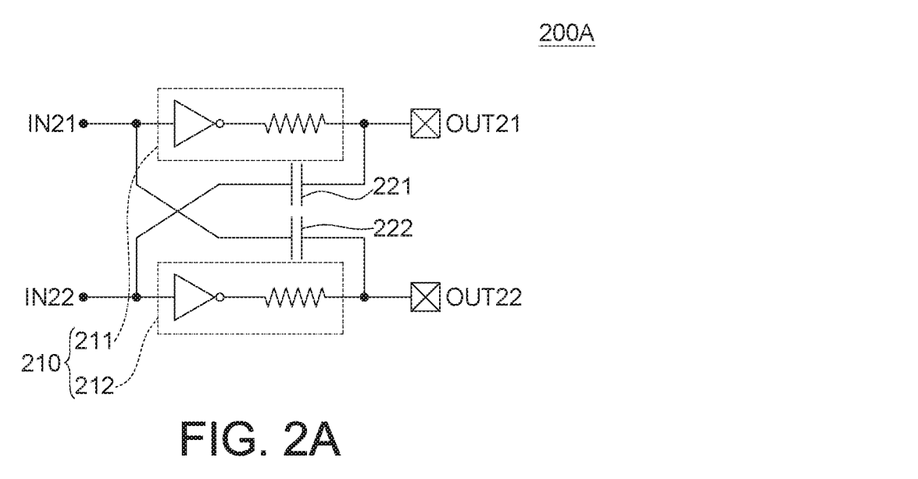
FIG. 2A shows a driver circuit according to one embodiment.

Please refer to FIG. 2A, which shows a driver circuit 200A according to one embodiment. In this embodiment, a differential driver 210 including a first half circuit 211 and a second half circuit 212 is a voltage mode source-series terminated (SST) driver.

A first feedback passive circuit 221 is coupled to a second input point IN22 and a first output point OUT21; and a second feedback passive circuit 222 is coupled to a first input point IN21 and a second output point OUT22. That is to say, the first feedback passive circuit 221 and the second feedback passive circuit 222 are cross coupled between the first input point IN21, the second input point IN22, the first output point OUT21 and the second output point OUT22. In this embodiment, the slew rate of the driver circuit 200A which is a voltage mode driver can be speeded up due to the cross coupled feedback circuitry arrangement.

Figure 2B:
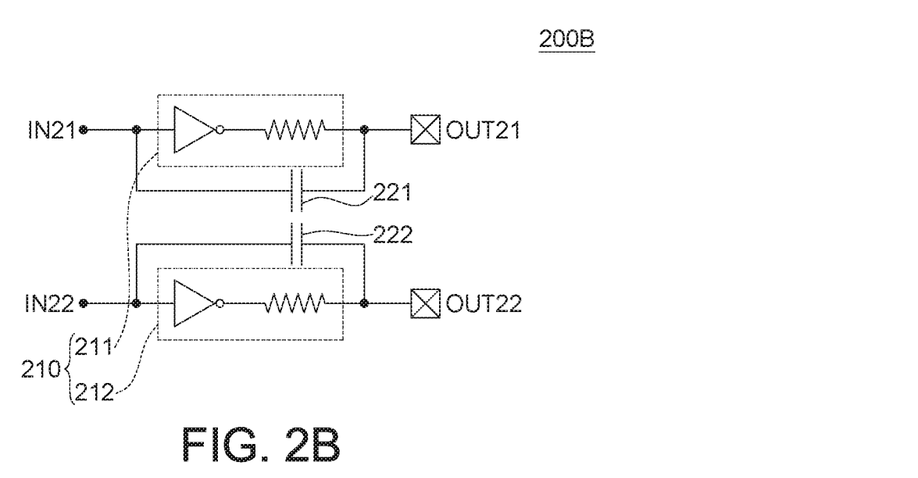
FIG. 2B shows a driver circuit according to one embodiment.

Please refer to FIG. 2B, which shows a driver circuit 200B according to one embodiment. In this embodiment, the differential driver 210 is a voltage mode source-series terminated (SST) driver and the first feedback passive circuit 221 is coupled to the first input point IN21 and the first output point OUT21; and the second feedback passive circuit 222 is coupled to the second input point IN22 and the second output point OUT22. That is to say, the first feedback passive circuit 221 and the second feedback passive circuit 222 are parallel coupled between the first input point IN21, the second input point IN22, the first output point OUT21 and the second output point OUT22. In this embodiment, the slew rate of the driver circuit 200B which is a voltage mode driver can be slowed down due to the parallel coupled feedback circuitry arrangement.

Figure 2C:
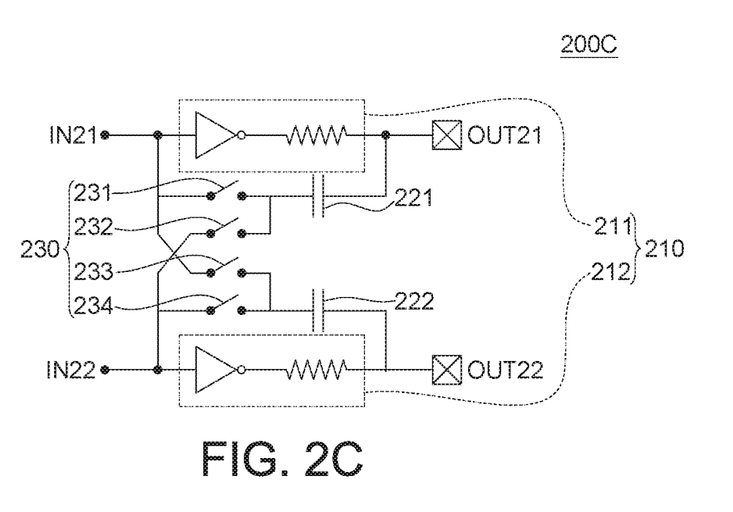
FIG. 2C shows a driver circuit according to one embodiment.

Please refer to FIG. 2O, which shows a driver circuit 200C according to one embodiment. In this embodiment, the differential driver 210 is a voltage mode source-series terminated (SST) driver and the driver circuit 200C further includes a switch circuit 230. The switch circuit 230 is for switching the driver circuit 200C between a first mode and a second mode.

In the first mode, the first feedback passive circuit 221 is coupled to the second input point IN22 and the first output point OUT21; and the second feedback passive circuit 222 is coupled to the first input point IN21 and the second output point OUT22.

In the second mode, the first feedback passive circuit 221 is coupled to the first input point IN21 and the first output point OUT21; and the second feedback passive circuit 222 is coupled to the second input point IN22 and the second output point OUT22.

For example, the switch circuit 230 includes a first switch device 231, a second switch device 232, a third switch device 233 and a fourth switch device 234. The first switch device 231 is disposed between the first feedback passive circuit 221 and the first input point IN21. The second switch device 232 is disposed between the first feedback passive circuit 221 and the second input point IN22. The third switch device 233 is disposed between the second feedback passive circuit 222 and the first input point IN21. The fourth switch device 234 is disposed between the second feedback passive circuit 222 and the second input point IN22.

In the first mode, the second switch device 232 and the third switch device 233 are turned on; and the first switch device 231 and the fourth switch device 234 are turned off. As such, a cross coupled feedback circuitry arrangement is formed in the driver circuit 200C which is a voltage mode driver, and the slew rate of the driver circuit 200C can be speeded up.

In the second mode, the first switch device 231 and the fourth switch device 234 are turned on; and the second switch device 232 and the third switch device 233 are turned off. As such, a parallel coupled feedback circuitry arrangement is formed in the driver circuit 200C which is a voltage mode driver, and the slew rate of the driver circuit 200C can be slowed down.

Figure 3A:
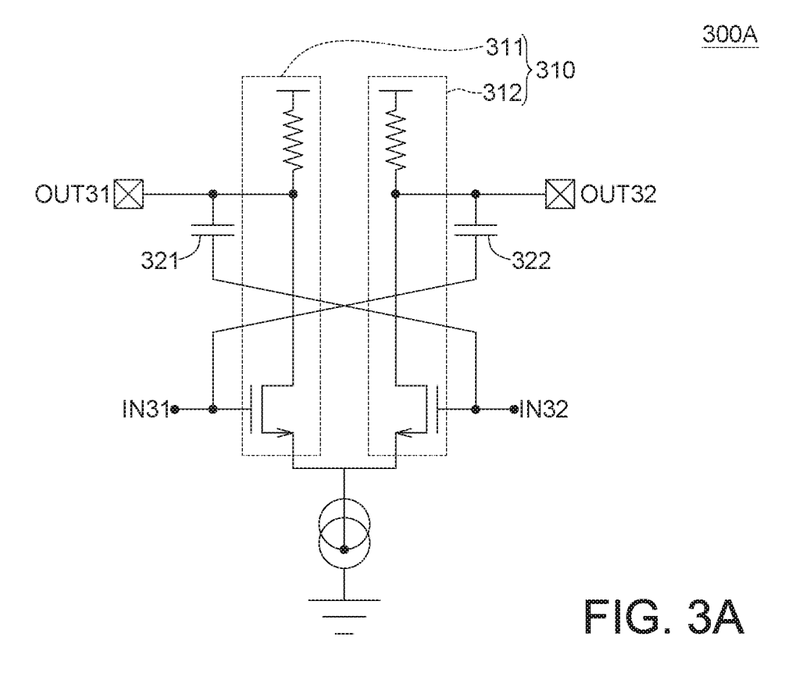
FIG. 3A shows a driver circuit according to one embodiment.

Please refer to FIG. 3A, which shows a driver circuit 300A according to one embodiment. In this embodiment, a differential driver 310 including a first half circuit 311 and a second half circuit 312 is a current mode driver.

A first feedback passive circuit 321 is coupled to a second input point IN32 and a first output point OUT31; and a second feedback passive circuit 322 is coupled to a first input point IN31 and a second output point OUT32. That is to say, the first feedback passive circuit 321 and the second feedback passive circuit 322 are cross coupled between the first input point IN31, the second input point IN32, the first output point OUT31 and the second output point OUT32. In this embodiment, the slew rate of the driver circuit 300A which is a current mode driver can be speeded up due to the cross coupled feedback circuitry arrangement.

Figure 3B:
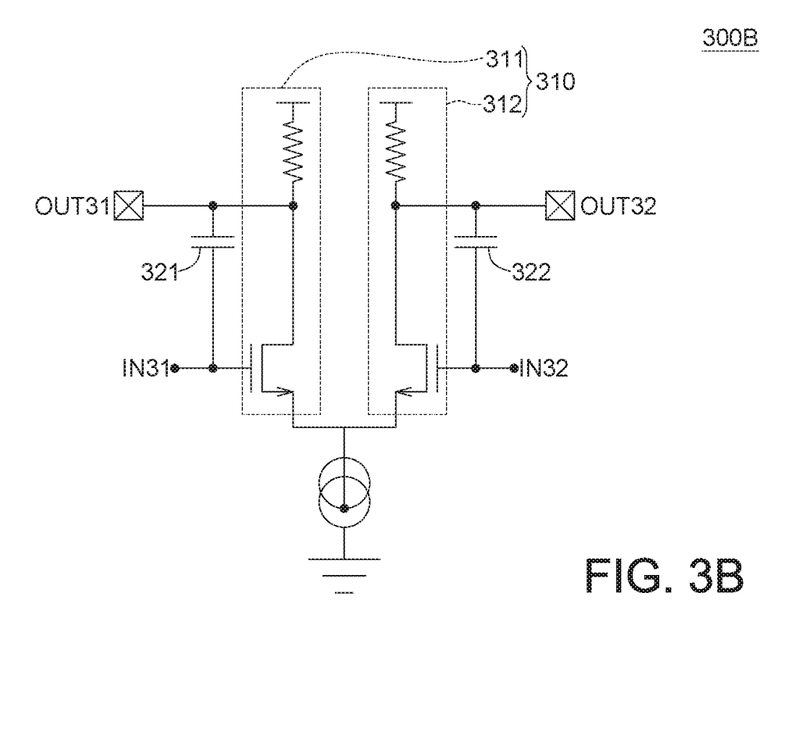
FIG. 3B shows a driver circuit according to one embodiment.

Please refer to FIG. 3B, which shows a driver circuit 300B according to one embodiment. In this embodiment, the differential driver 310 is a current mode driver; the first feedback passive circuit 321 is coupled to the first input point IN31 and the first output point OUT31; and the second feedback passive circuit 322 is coupled to the second input point IN32 and the second output point OUT32. That is to say, the first feedback passive circuit 321 and the second feedback passive circuit 322 are parallel coupled between the first input point IN31, the second input point IN32, the first output point OUT31 and the second output point OUT32. In this embodiment, the slew rate of the driver circuit 300B which is a current mode driver can be slowed down due to the parallel coupled feedback circuitry arrangement.

Figure 3C:
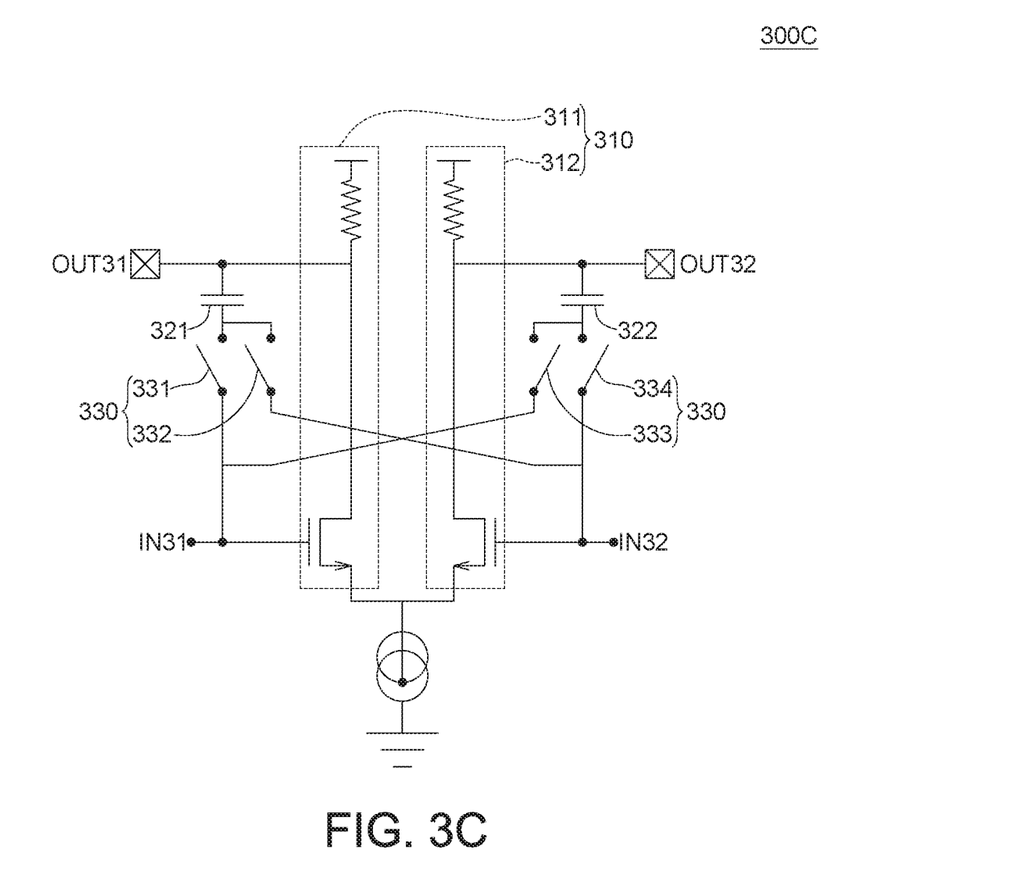
FIG. 3C shows a driver circuit according to one embodiment.

Please refer to FIG. 3O, which shows a driver circuit 300C according to one embodiment. In this embodiment, the differential driver 310 is a current mode driver, and the driver circuit 300C further includes a switch circuit 330. The switch circuit 330 is for switching the driver circuit 300C between a first mode and a second mode.

In the first mode, the first feedback passive circuit 321 is coupled to the second input point IN32 and the first output point OUT31; and the second feedback passive circuit 322 is coupled to the first input point IN31 and the second output point OUT32.

In the second mode, the first feedback passive circuit 321 is coupled to the first input point IN31 and the first output point OUT31; and the second feedback passive circuit 322 is coupled to the second input point IN32 and the second output point OUT32.

For example, the switch circuit 330 includes a first switch device 331, a second switch device 332, a third switch device 333 and a fourth switch device 334. The first switch device 331 is disposed between the first feedback passive circuit 321 and the first input point IN31. The second switch device 332 is disposed between the first feedback passive circuit 321 and the second input point IN32. The third switch device 333 is disposed between the second feedback passive circuit 322 and the first input point IN31. The fourth switch device 334 is disposed between the second feedback passive circuit 322 and the second input point IN32.

In the first ode, the second switch device 332 and the third switch device 333 are turned on; and the first switch device 331 and the fourth switch device 334 are turned off. As such, a cross coupled feedback circuitry arrangement is formed in the driver circuit 300C which is a current mode driver, and the slew rate of the driver circuit 300C can be speeded up.

In the second mode, the first switch device 331 and the fourth switch device 334 are turned on; and the second switch device 332 and the third switch device 333 are turned off. As such, a parallel coupled feedback circuitry arrangement is formed in the driver circuit 300C which is a current mode driver, and the slew rate of the driver circuit 300C can be slowed down.

Figure 4:
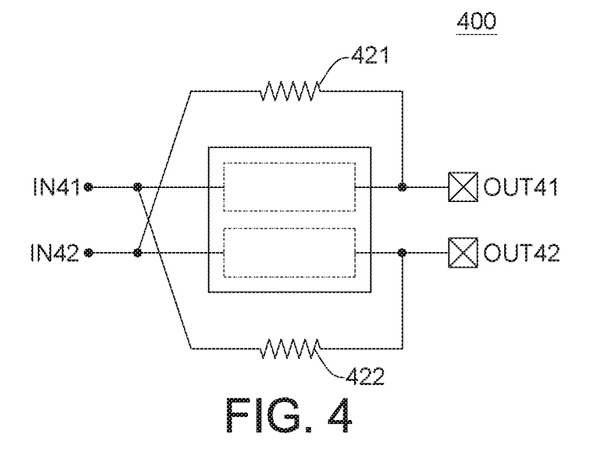
FIG. 4 shows a driver circuit according to one embodiment.

Please refer to FIG. 4, which shows a driver circuit 400 according to one embodiment. In this embodiment, each of a first feedback passive circuit 421 and a second feedback passive circuit 422 is a resistor. The first feedback passive circuit 421 and the second feedback passive circuit 422 may be cross coupled between a first input point IN41, a second input point IN42, a first output point OUT41 and a second output point OUT42, such that the slew rate of the driver circuit 400 can be speeded up due to the cross coupled feedback circuitry arrangement.

Or, in another embodiment (not shown), the first feedback passive circuit 421 and the second feedback passive circuit 422 may be parallel coupled between the first input point IN41, the second input point IN42, the first output point OUT41 and the second output point OUT42, such that the slew rate of the driver circuit 400 can be slowed down due to the parallel coupled feedback circuitry arrangement.

Or, in another embodiment (not shown), a switch circuit may be used for switching the driver circuit 400 between the cross coupled feedback circuitry arrangement and the parallel coupled feedback circuitry arrangement for selectively slowing down or speeding up the slew rate.

Figure 5:
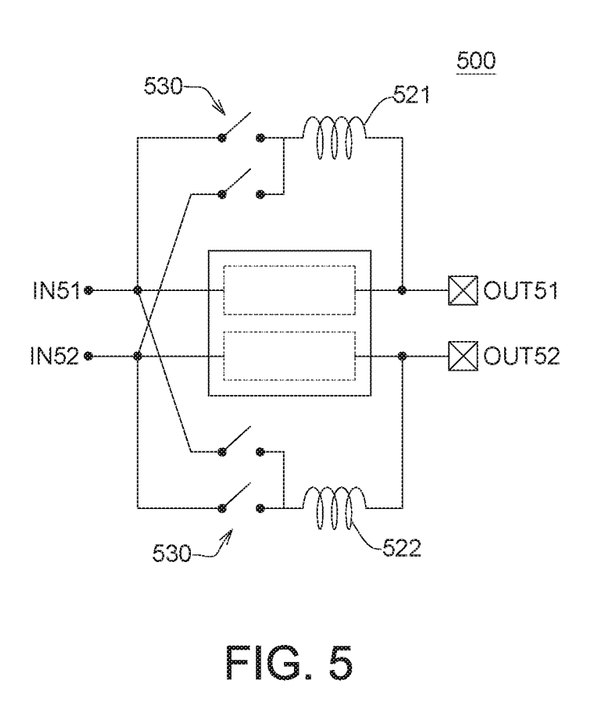
FIG. 5 shows a driver circuit according to one embodiment.

Please refer to FIG. 5, which shows a driver circuit 500 according to one embodiment. In this embodiment, each of a first feedback passive circuit 521 and a second feedback passive circuit 522 is an inductor. A switch circuit 530 is used for switching the driver circuit 500 between the cross coupled feedback circuitry arrangement and the parallel coupled feedback circuitry arrangement for selectively slowing down or speeding up the slew rate.

Or, in another embodiment (not shown), the first feedback passive circuit 521 and the second feedback passive circuit 522 may be cross coupled between a first input point IN51, a second input point IN52, a first output point OUT51 and a second output point OUT52, such that the slew rate of the driver circuit 500 can be speeded up due to the cross coupled feedback circuitry arrangement.

Or, in another embodiment (not shown), the first feedback passive circuit 521 and the second feedback passive circuit 522 may be parallel coupled between the first input point IN51, the second input point IN52, the first output point OUT51 and the second output point OUT52, such that the slew rate of the driver circuit 500 can be slowed down due to the parallel coupled feedback circuitry arrangement.

Figure 6:
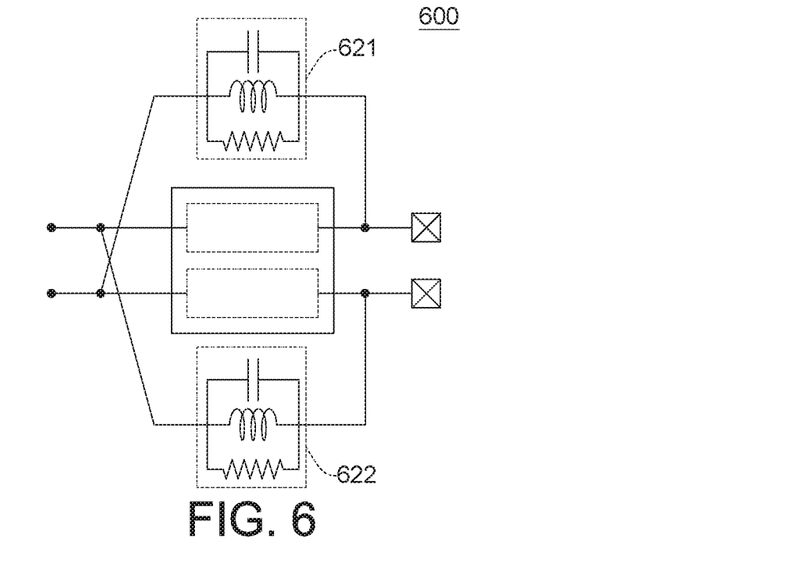
FIG. 6 shows a driver circuit according to one embodiment.

Please refer to FIG. 6, which shows a driver circuit 600 according to one embodiment. In this embodiment, each of a first feedback passive circuit 621 and a second feedback passive circuit 622 includes a plurality of passive components connected in parallel. For balancing the feedback, the first feedback passive circuit 621 and the second feedback passive circuit 622 are substantially equivalent.

Figure 7:
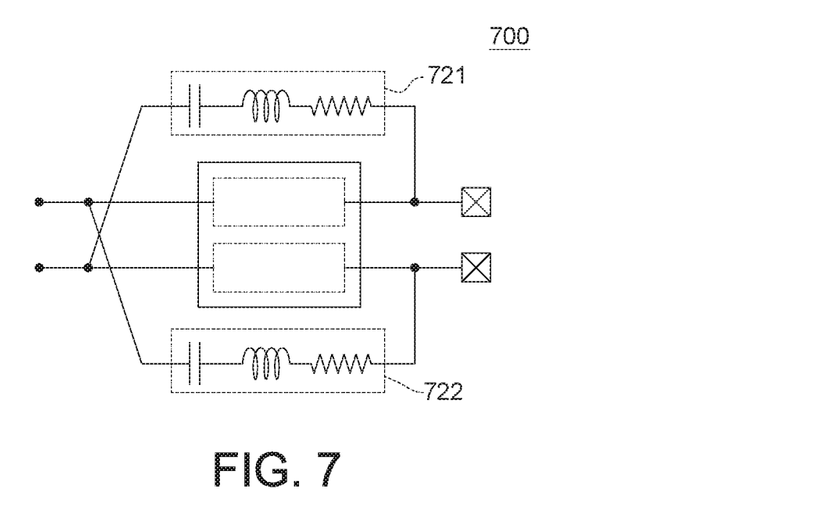
FIG. 7 shows a driver circuit according to one embodiment.

Please refer to FIG. 7, which shows a driver circuit 700 according to one embodiment. In this embodiment, each of a first feedback passive circuit 721 and a second feedback passive circuit 722 includes a plurality of passive components connected in series. For balancing the feedback, the first feedback passive circuit 721 and the second feedback passive circuit 722 are substantially equivalent.

Base on the above embodiments, the slew rate of the driver circuit can be controlled to be speeded up or be slowed down to meet the design need.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A driver circuit, comprising:
   a differential driver, including:
     a first half circuit, having a first input point and a first output point; and
     a second half circuit, having a second input point and a second output point;
   a first feedback passive circuit;
   a second feedback passive circuit; and
   a switch circuit, for switching the driver circuit between a first mode and a second mode;
   wherein in the first mode, the first feedback passive circuit is coupled to the second input point and the first output point, and the second feedback passive circuit is coupled to the first input point and the second output point;
   in the second mode, the first feedback passive circuit is coupled to the first input point and the first output point, and the second feedback passive circuit is coupled to the second input point and the second output point;
   in the first mode and in the second mode, the first input point is connected to the first half circuit and the second input point is connected to the second half circuit;
   in the first mode, the first input point and the first outpoint are disconnected; and
   in the second mode, the first input point and the second input point are disconnected.

2. The driver circuit according to claim 1, wherein the switch circuit includes:
   a first switch device, disposed between the first feedback passive circuit and the first input point;
   a second switch device, disposed between the first feedback passive circuit and the second input point;
   a third switch device, disposed between the second feedback passive circuit and the first input point; and
   a fourth switch device, disposed between the second feedback passive circuit and the second input point.

3. The driver circuit according to claim 1, wherein the first feedback passive circuit and the second feedback passive circuit are substantially equivalent.

4. The driver circuit according to claim 1, wherein each of the first feedback passive circuit and the second feedback passive circuit is a capacitor, a resistor, an inductor or a combination thereof.

5. The driver circuit according to claim 1, wherein each of the first feedback passive circuit and the second feedback circuit includes a plurality of passive components connected in series.

6. The driver circuit according to claim 1, wherein each of the first feedback passive circuit and the second feedback circuit includes a plurality of passive components connected in parallel.

* * * * *